(12) United States Patent
Hamasaki

(10) Patent No.: US 7,187,048 B2
(45) Date of Patent: Mar. 6, 2007

(54) SEMICONDUCTOR LIGHT-RECEIVING DEVICE

(75) Inventor: Hiroshi Hamasaki, Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/813,827

(22) Filed: Mar. 22, 2001

(65) Prior Publication Data
US 2001/0050403 A1 Dec. 13, 2001

(30) Foreign Application Priority Data
Mar. 22, 2000 (JP) ............... 2000-080200

(51) Int. Cl.
H01L 27/14 (2006.01)
(52) U.S. Cl. ..................................... 257/431
(58) Field of Classification Search ................ 257/431, 257/436
See application file for complete search history.

(56) References Cited
U.S. PATENT DOCUMENTS
6,118,165 A * 9/2000 Yano ........................... 257/436

FOREIGN PATENT DOCUMENTS
JP 10-270744 10/1998

* cited by examiner

Primary Examiner—Zandra V. Smith
Assistant Examiner—Kiesha Rose
(74) Attorney, Agent, or Firm—Oblon, Spivak, McClelland, Maier & Neustadt, P.C.

(57) ABSTRACT

A semiconductor light-receiving device includes a plurality of first conductive type second semiconductor layers formed on a first surface of a first conductive type semiconductor substrate apart from each other. Each of the first conductive type second semiconductor layers is surrounded by a second conductive type third semiconductor layer with a first semiconductor layer therebetween. The first semiconductor layer has a lower impurity concentration than the second semiconductor layers. By completely depleting the first semiconductor layer occupying a large area within the light-receiving surface, the light entering the light-receiving surface is enabled to contribute to a photoelectric current while reducing the light absorption in the second semiconductor layers, so that the sensitivity characteristics of the semiconductor light-receiving device can be made superior and the production cost can be lowered.

12 Claims, 8 Drawing Sheets

Prior Art

Prior Art

SEMICONDUCTOR LIGHT-RECEIVING DEVICE

CROSS-REFERENCE TO RELATED APPLICATIONS

This application claims priority under 35 U.S.C 119 to Japanese Patent Application No. 2000/080200, filed Mar. 22, 2000, the entire contents of which are incorporated herein by reference.

BACKGROUND OF THE INVENTION

1. Field of the Invention

The present invention relates to a semiconductor light-receiving device, and particularly to a semiconductor light-receiving device in optical communication and optical transmission technologies.

2. Discussion of the Background

In the instruments utilizing semiconductors, such as computers and communication instruments, semiconductors such as IC, mounted on the instruments, become larger in capacity year by year. With such a development, an increase of the capacity in signal transmission means has been required. This tendency extends to the peripheries of terminal computers of the communication, and memory, where having a large capacity has been required more and more. Particularly, the demand for optical disks having portability has increased more and more, a larger capacity has been more and more required, and various systems have been investigated and developed.

Of these systems, a more practically used one is a system wherein a storage spot area is reduced by shortening a wavelength of the light source. For this system, a system of using a blue semiconductor laser is promising. Hitherto, a DVD using a red semiconductor laser has been on the market, and in this case, a silicon photodiode has been used as a light-receiving element. This photodiode has a high sensitivity to a red color and has high reliability. Also, by making the most of the merit for mass production, it becomes possible to produce the photodiode at a very low cost by improving the process, etc.

As a photodiode used for reproducing optical disk signals, for example, an example shown by Japanese Patent Laid-Open No. 270744/1998 is known. This example is shown in FIG. 7. In FIG. 7, element 81 is a P-type high specific resistance semiconductor substrate, 72 and 75 are P-type separating diffusion regions, 73 is a P-type embedding diffusion region, 74 is an N-type epitaxial layer, 76 is an N-type diffusion region, 82 is an oxide film, and 83 is an electrode for taking out a substrate potential. The P-type separating diffusion regions 72 and 75 are disposed such that they electrically separate the N-type epitaxial layer 74 into plural regions and that the outsides of the regions of both ends thereof in FIG. 7 are electrically separated. Each separated region functions as a photodiode (photodetecting portion).

However, since the N-type diffusion region 76 of each photodiode is formed on substantially the whole surface of the light-receiving region, when the wavelength becomes short, the absorption in the N-type diffusion region 76 becomes large. FIG. 8 is a characteristic view showing a relation between the depth from an incident surface of the N-type diffusion region 76 and the intensity of a transmitted light when a blue light of 400 nm enters silicon. As shown in FIG. 8, as the depth becomes deeper, the intensity of the transmitted light is greatly reduced. Accordingly, by the structure of the photodiode of the related art shown in FIG. 7, a sufficient sensitivity cannot be obtained to a blue light having a short wavelength.

Thus, it may be considered that by making the thickness of the N-type diffusion region 76 extremely thin as, for example, about 0.1 µm, an excessive loss by the light absorption is reduced, but because high process controlling properties are required, there is a problem of increasing the cost.

As described above, when the light absorption becomes large in the surface diffusion layer of a semiconductor light-receiving element, there are problems that the intensity of a transmitted light is reduced and that the sensitivity characteristics of a light-receiving element are deteriorated. Also, although it may be considered that by making the thickness of the surface diffusion layer extremely thin, an excessive loss of the light absorption is reduced, but there is a problem of increasing the cost because high process controlling properties are required.

SUMMARY OF THE INVENTION

Accordingly, an object of this invention is to provide a novel semiconductor light-receiving element having an excellent sensitivity and capable of being produced by a production process of low cost.

A first aspect of the invention is to provide a semiconductor light-receiving device comprising a first conductive type semiconductor substrate having a first surface on a light-receiving side and a second surface on the opposite side to said first surface; a first semiconductor layer formed on said first surface of said semiconductor substrate; a plurality of first conductive type second semiconductor layers reaching said semiconductor substrate from a surface of said first semiconductor layer, said second semiconductor layers being formed apart from each other; a second conductive type third semiconductor layer selectively formed on the surface of said first semiconductor layer, said third semiconductor layer surrounding each of said second semiconductor layers with said first semiconductor layer therebetween; a first electrode formed on said third semiconductor layer; and a second electrode formed on said second surface of said semiconductor substrate; wherein a region of said first semiconductor layer between each of said second semiconductor layers and said third semiconductor layer has a higher resistance than resistances of said second semiconductor layers and said third semiconductor layer.

Also, a second aspect of the invention is to provide a semiconductor light-receiving device comprising a first conductive type semiconductor substrate having a first surface on a light-receiving side and a second surface on the opposite side to said first surface; a first semiconductor layer formed on said first surface of said semiconductor substrate; a plurality of first conductive type second semiconductor layers reaching said semiconductor substrate from a surface of said first semiconductor layer, said second semiconductor layers being formed apart from each other; a second conductive type third semiconductor layer selectively formed on the surface of said first semiconductor layer and having a plurality of openings, each of said second semiconductor layers being provided within each of said openings of said third semiconductor layer respectively with said first semiconductor layer therebetween; a first electrode formed on said third semiconductor layer; and a second electrode formed on said second surface of said semiconductor substrate; wherein a region of said first semiconductor layer between each of said second semiconductor layers and said third semiconductor layer has a higher resistance than resistances of said second semiconductor layers and said third semiconductor layer.

Also, a third aspect of the invention is to provide a semiconductor light-receiving device comprising a first conductive type semiconductor substrate having a first surface on a light-receiving side and a second surface on the opposite side to said first surface, said first surface including a plurality of protruded surface portions separated from each other; a first semiconductor layer selectively formed on said first surface of said semiconductor substrate, said first semiconductor layer having a higher resistance than a resistance of said semiconductor substrate and having a plurality of openings, each of said protruded surface portions of said first surface being exposed within each of said openings of said first semiconductor layer respectively; a second conductive type second semiconductor layer selectively formed on a surface of said first semiconductor layer and surrounding each of said protruded surface portions of said first surface with said first semiconductor layer therebetween; a first electrode formed on said second semiconductor layer; and a second electrode formed on said second surface of said semiconductor substrate.

Also, a fourth aspect of the invention is to provide a semiconductor light-receiving device comprising a first conductive type semiconductor substrate having a first surface on a light-receiving side and a second surface on the opposite side to said first surface, said first surface including a plurality of protruded surface portions separated from each other; a first semiconductor layer selectively formed on said first surface of said semiconductor substrate, said first semiconductor layer having a higher resistance than a resistance of said semiconductor substrate and having a plurality of openings, each of said protruded surface portions of said first surface being exposed within each of said openings of said first semiconductor layer respectively; a second conductive type second semiconductor layer selectively formed on a surface of said first semiconductor layer and having a plurality of openings, each of said protruded surface portions of said first surface being provided within each of said openings of said second semiconductor layer respectively with said first semiconductor layer therebetween; a first electrode formed on said second semiconductor layer; and a second electrode formed on said second surface of said semiconductor substrate.

It is desirable that the first to fourth aspects of the invention are provided with the following constituent features.

(1) The second conductive type third or second semiconductor layer is formed in a lattice form or a network form.

(2) The first electrode is formed in a lattice form or a network form on the third or second semiconductor layer.

(3) The first electrode is formed on part of the third or second semiconductor layer.

(4) Each of the plural second semiconductor layers or each of the protruded surface portions of the first surface is formed in an island form or a stripe form.

(5) The region of the first semiconductor layer between said third semiconductor layer and each of the second semiconductor layers is completely depleted in a state that a reverse bias is applied between the first electrode and the second electrode.

(6) The region of the first semiconductor layer between the second semiconductor layer and each of the protruded surface portions of the semiconductor substrate is completely depleted in a state that a reverse bias is applied between the first electrode and the second electrode.

In addition, in the first to fourth aspects of the invention, the first semiconductor layer of a lower impurity concentration than the semiconductor substrate may be any of a first conductive type semiconductor layer and a second conductive type semiconductor layer. From the viewpoint of forming the complete depletion as described above, the concentration is preferably about $1 \times 10^{14}$ cm$^{-3}$ or less.

The semiconductor light-receiving element of the first aspect of the invention has a structure wherein the plural first conductive type second semiconductor layers are formed apart from each other on the first surface of the first conductive type semiconductor substrate, the second conductive type third semiconductor layer surrounds each of these first conductive type second semiconductor layers with the first semiconductor layer of a lower impurity concentration than the semiconductor substrate therebetween. That is, the second semiconductor layers are not formed on substantially the whole of the light-receiving surfaces of the second semiconductor layers but formed on only a part of the first surface. Furthermore, because the plural second semiconductor layers are electrically connected to the second electrode formed on the second surface on the opposite side of the semiconductor substrate to the first surface thereof, only one (the first electrode) of a pair of electrodes constituting the light-receiving element is formed within the light-receiving surface. By the structure described above, the area occupied by the first semiconductor layer of a low impurity concentration to the light-receiving surfaces can be increased.

Furthermore, when an electric field is applied between the second semiconductor layers and the third semiconductor layer, the electric field contains many parallel components to the surface of the semiconductor substrate. Accordingly, the depletion layer spreads to the width direction along the substrate surface within the first semiconductor layer of a low impurity concentration, and the first semiconductor layer appearing within the light-receiving surface can be easily and completely depleted between the second semiconductor layers and the third semiconductor layer.

Accordingly, by completely depleting the first semiconductor layer occupying a large area within the light-receiving surface, the incident light on the light-receiving surface is enabled to contribute to a photoelectric current, while reducing the light absorption in the second semiconductor layers, so that the sensitivity characteristics of the semiconductor light-receiving element can be made superior. The constituent features of the semiconductor light-receiving element as described above can be formed by an ordinary semiconductor process, and the cost in the production process can be lowered.

In the semiconductor light-receiving element of the second aspect of the invention, by completely depleting the first semiconductor layer occupying a large area within the light-receiving surface as in the case of the semiconductor light-receiving element of the first aspect, the incident light on the light-receiving surface is enabled to contribute to a photoelectric current while reducing the light absorption in the plural surface portions of the first conductive type semiconductor substrate, so that the sensitivity characteristics of the semiconductor light-receiving element can be made superior. The constituent features of such a semiconductor light-receiving element can also be formed by an ordinary semiconductor process, and the cost in the production process can be lowered.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DESCRIPTION OF THE PREFERRED EMBODIMENTS

Figure 1A:
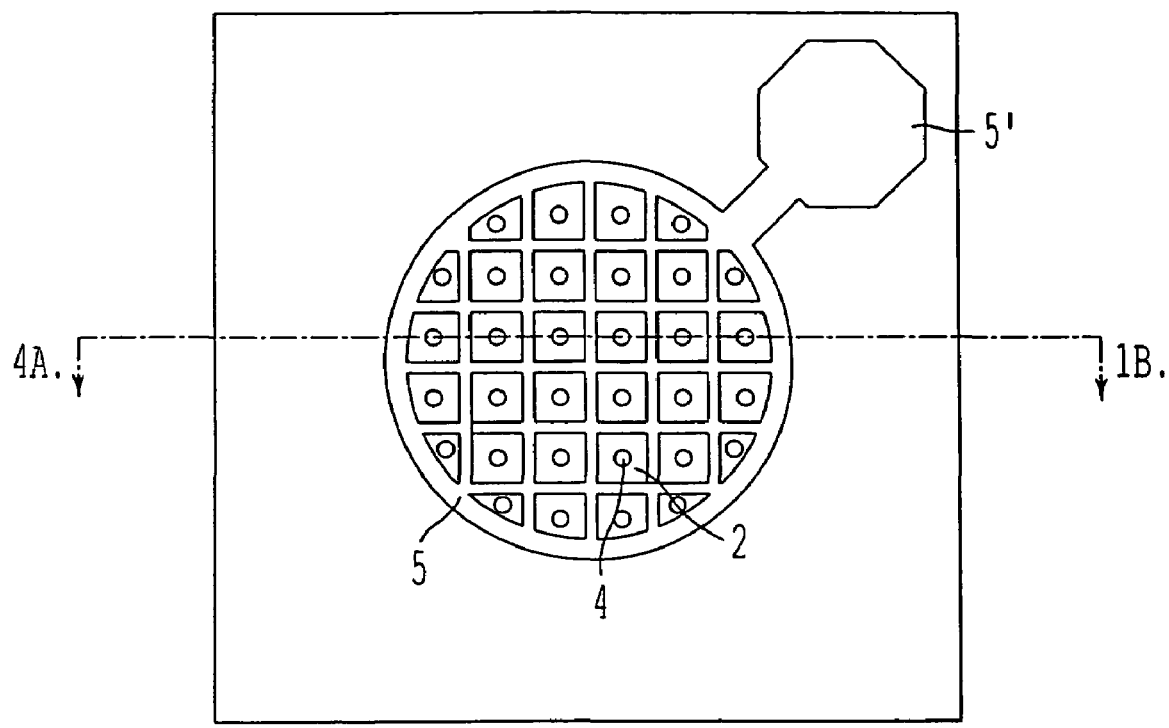
FIGS. 1A and 1B are a plan view and a cross-sectional view, respectively, showing a structure of a first embodiment of the semiconductor light-receiving element of the invention.

Referring now to the drawings, wherein like reference numerals designate identical or corresponding parts throughout the several views.

Embodiments of the invention are explained in detail with reference to drawings.

(First Embodiment)

Figure 1B:
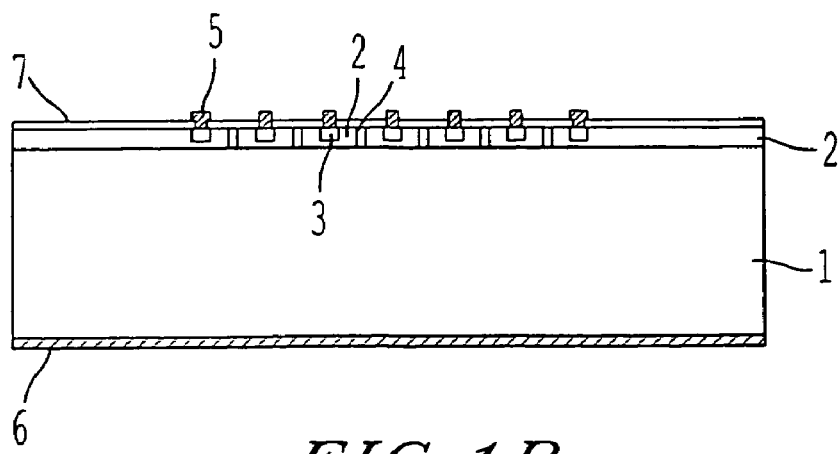

FIGS. 1A and 1B are a plan view and a cross-sectional view, showing a structure of the first embodiment of the semiconductor light-receiving element of the invention, wherein FIG. 1A is a plan view of the light-receiving element of the embodiment, and FIG. 1B is a cross-sectional view cut along the line A–A' of FIG. 1A. As shown in FIGS. 1A and 1B, on one surface of an n$^+$-type silicon substrate 1 (impurity concentration: $1\times10^{19}$ cm$^{-3}$) is formed an n$^-$-type silicon layer 2 of a high resistance (impurity concentration: $1\times10^{14}$ cm$^{-3}$, hereinafter, corresponding to an i layer). The n$^-$-type silicon layer 2 is a layer formed on the n$^+$-type silicon substrate 1 by epitaxial growth.

In the plural regions of the n$^-$-type silicon layer 2, n$^+$-type silicon regions 4 (impurity concentration: $1\times10^{19}$ cm$^{-3}$) are formed by diffusion from the surface of the n$^-$-type silicon layer 2 so as to reach the n$^+$-type silicon substrate 1 by diffusion. The n$^+$-type silicon regions 4 are formed in a columnar form, and each is formed in an island form and disposed in a two-dimensional matrix form, as shown in FIG. 1A.

On the surface of the n$^-$-type silicon layer 2 is formed p$^+$-type silicon region 3 (impurity concentration: $1\times10^{19}$ cm$^{-3}$) by diffusion so as to surround the periphery of the n$^+$-type silicon regions 4. In this example, the p$^+$-type silicon region 3 is formed in a lattice form as shown in FIG. 1A. The depth of the p$^+$-type silicon region 3 is a depth not reaching the n$^+$-type silicon substrate 1, and the n$^-$-type silicon layer 2 exists between the p$^+$-type silicon region 3 and the n$^+$-type silicon substrate 1.

On the surface of the p$^+$-type silicon region 3 is formed a p-side electrode 5, and as shown in FIG. 1A. The p-side electrode 5 is formed in a lattice form so as to substantially superpose the p$^+$-type silicon region 3. In addition, they are not always superposed with each other. The region forming the p-side electrode 5 may be included within the p$^+$-type silicon region 3, or the p$^+$-type silicon region 3 may be included within the region forming the p-side electrode 5 if the p-side electrode 5 is insulated from each of the n$^+$-type silicon substrate 1, the n$^-$-type silicon layer 2, and the n$^+$-type silicon regions 4. However, for the requirement of ensuring a large amount of light received, the former is preferred. The p-side electrode 5 is electrically connected to an extraction electrode 5'.

On the other hand, on a surface on the opposite side of the n$^+$-type silicon substrate 1 is formed an n-side electrode 6. In FIG. 1B, element 7 is an insulating film, which functions to insulate the p-side electrode 5 electrically from each of the n$^+$-type silicon substrate 1, the n$^-$-type silicon layer 2, and the n$^+$-type silicon regions 4 and to protect the surface of the n$^+$-type silicon substrate 1 so as to prevent the occurrence of leakage between the n$^+$-type silicon regions 4 and the p$^+$-type silicon region 3.

According to the semiconductor light-receiving element of the embodiment of the invention, the plural n$^+$-type silicon regions 4 are formed on the first surface of the n$^+$-type silicon substrate 1 parting from each other, and the p$^+$-type silicon region 3 surround each of the n$^+$-type silicon regions 4 with the n$^-$-type silicon layer 2 therebetween. That is, the n$^+$-type silicon regions 4 are not formed on substantially the whole surface of the light-receiving surface but formed on only a part of the first surface. Furthermore, because the plural n$^+$-type silicon regions 4 are electrically connected to the n-side electrode 6 formed on the second surface on the opposite side of the n$^+$-type silicon substrate 1 to the first surface, only one (the p-side electrode 5) of a pair of electrodes constituting the light-receiving element is formed within the light-receiving surface. By the structure described above, the area of the n$^-$-type silicon layer 2 occupying the light-receiving surface is increased.

Moreover, when an electric field is applied between the n$^+$-type silicon regions 4 and the p$^+$-type silicon region 3, the electric field includes many parallel components to the surface of the n$^+$-type silicon substrate 1. Accordingly, the depletion layer spreads to the width direction along the substrate surface within the n$^-$-type silicon layer 2, and the definite bias or above. The n$^-$-type silicon layer 2 appearing in the light-receiving surface is easily and completely depleted between the n$^+$-type silicon regions 4 and the p$^+$-type silicon region 3.

Therefore, by completely depleting the n$^-$-type silicon layer 2 occupying a large area within the light-receiving surface, the incident light on the light-receiving surface is enabled to contribute to a photoelectric current while reducing the light absorption in the n$^+$-type silicon regions 4, so that the sensitivity characteristics of the semiconductor light-receiving element can be made superior. The constituent features of the semiconductor light-receiving element described above can be formed by an ordinary semiconductor process, and the cost in the production process can be lowered.

The bias voltage value required for the complete depletion of the n⁻-type silicon layer 2 is restrained by the performance of driver IC, a break voltage, etc. But in order to keep the bias voltage low, the mesh may be constituted fine. For example, when the reverse bias is −2.5 V, in the case of calculating a parallel plate approximation, if the impurity concentration of the p⁺-type silicon region 3 is $1×10^{19}$ cm$^{-3}$, and the impurity concentration of the n⁻-type silicon layer 2 is $1×10^{14}$ cm$^{-3}$, the depletion layer can reach about 20 μm. In this case, a width of the n⁻-type silicon layer 2 between the p⁺-type silicon region 3 and the n⁺-type silicon regions 4 in the width direction may be made about 20 μm.

Figure 8:
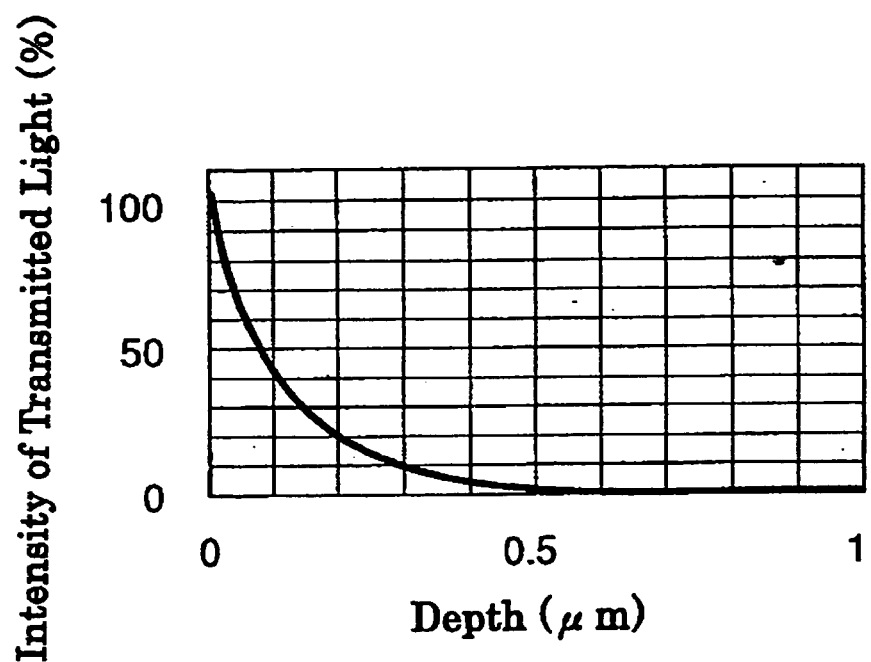
FIG. 8 is a characteristic view showing a relation between the depth from an incident surface of an N-type diffusion region and the intensity of a transmitted light when a blue light of 400 nm enters silicon.

A part of the light entering the depletion layer within the n⁻-type silicon layer 2 is absorbed to form an electron-hole pair. By the voltage applied between the p⁺-type silicon region 3 and the n⁺-type silicon region 4, the electron-hole pair drift, are scarcely recombined in the depletion layer, and enter the n⁺-type silicon region 4 and the p⁺-type silicon region 3, respectively, to form a photoelectric current. When the n⁻-type silicon layer 2 is almost all depleted within the vicinity of the light-receiving surface, if the width of the p⁺-type silicon region 3 in the lattice form is 5 μm, the pitch of the lattice is 30 μm, and the diameter of the n⁺-type silicon regions 4 in a circle form is 5 μm, the area of the n⁻-type silicon layer 2 occupying the photodetecting surface becomes about 67% of the photodetecting surface, and the incident light of almost the same ratio can reach the depletion layer without transmitting the n⁺-type silicon regions 4. With a blue light of 400 nm, in the case of silicon, the ratio capable of transmitting the diffusion layer of 0.3 μm is at most 10% as shown in FIG. 8, and by the structure of the light-receiving element, it is possible to increase the sensitivity greatly.

Figure 2A:
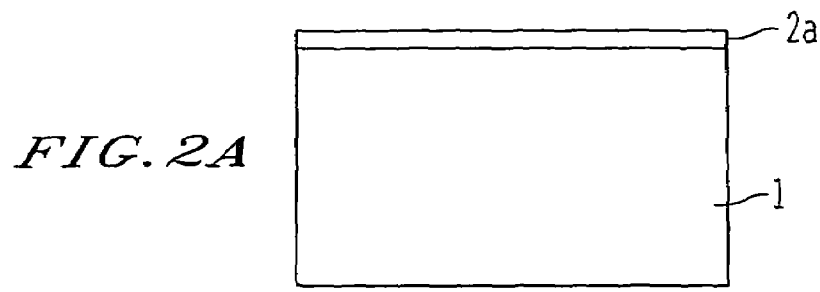
FIGS. 2A, 2B, 2C, 2D, and 2E are cross-sectional views of steps showing a process for producing the semiconductor light-receiving element of the first embodiment of the invention.

The process for producing the semiconductor light-receiving element of the embodiment of the invention is explained below. FIGS. 2A, 2B, 2C, 2D, and 2E are cross-sectional views of steps showing the production process. First, as shown in FIG. 2A, an n⁻-type silicon layer 2a of from about 1 to 2 μm in thickness is formed by epitaxial growth on the n⁺-type silicon substrate 1.

Figure 2B:
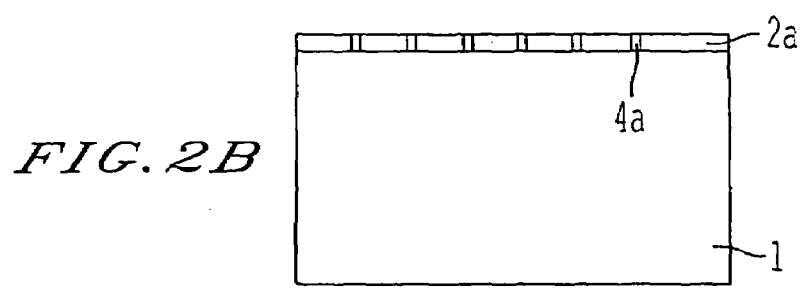

Then, as shown in FIG. 2B, an ion of an n-type impurity (for example, P or Sb) is partially implanted from the surface of the n-type silicon layer 2a using a mask (not shown). In this case, the ion is implanted to a depth at which the ion-implanted impurity can reach the n⁺-type silicon substrate 1 after annealing to be carried out subsequently. Furthermore, by carrying out annealing, the n⁺-type silicon regions 4a are formed such that the n⁺-type silicon regions 4a reach the n⁺-type silicon substrate 1 from the surface of the n⁻-type silicon layer 2a.

Figure 2C:
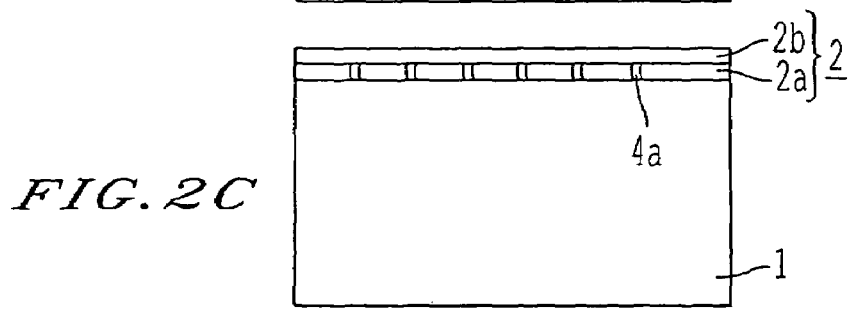

Then, as shown in FIG. 2C, an n⁻-type silicon layer 2b is formed again by epitaxial growth in a thickness of from about 1 to 2 μm. The n⁻-type silicon layer 2b is formed at the same concentration as in the n⁻-type silicon layer 2a, and they are integrated together to form the n⁻-type silicon layer 2.

Figure 2D:
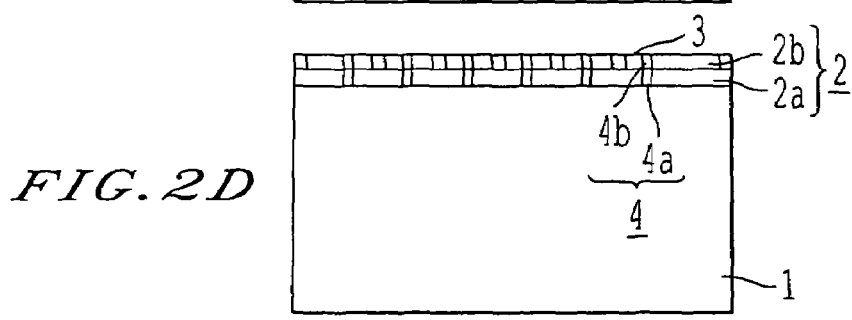

Thereafter, as shown in FIG. 2D, an ion of the n-type impurity (for example, P or Sb) is implanted again from the surface of the n⁻-type silicon layer 2b, and by further carrying out annealing, n⁺-type silicon regions 4b are formed. In this case, the ion injection is carried out by performing mask matching such that the n⁺-type silicon regions 4b are joined with the n⁺-type silicon regions 4a after annealing. After annealing, the n⁺-type silicon regions 4b are formed at the same concentration as in the n⁺-type silicon regions 4a, and they are integrated together to form the n⁺-type silicon regions 4.

Then, an ion of a p-type impurity (for example, B) is implanted from the surface of the n⁻-type silicon layer 2b using a mask (not shown). In this case, the ion is implanted to a depth at which the ion-implanted impurity does not reach the n-type silicon substrate 1 after annealing to be carried out subsequently. Furthermore, by carrying out annealing, p⁺-type silicon region 3 are formed on the surface of the n⁻-type silicon layer 2b. The p⁺-type silicon region 3 are formed such that they reach the n⁻-type silicon layer 2a.

Then, by repeating the steps shown in FIG. 2C and FIG. 2D, it is possible to form the n⁻-type silicon layer 2 having a deep depth. In this case, because a high-temperature process is carried out every epitaxial growth, a care must be taken for preventing the occurrence of excessive diffusion of the impurity.

In addition, there is no restriction on the order of the formation of the n⁺-type silicon regions 4b and the formation of the p⁺-type silicon region 3.

Figure 2E:
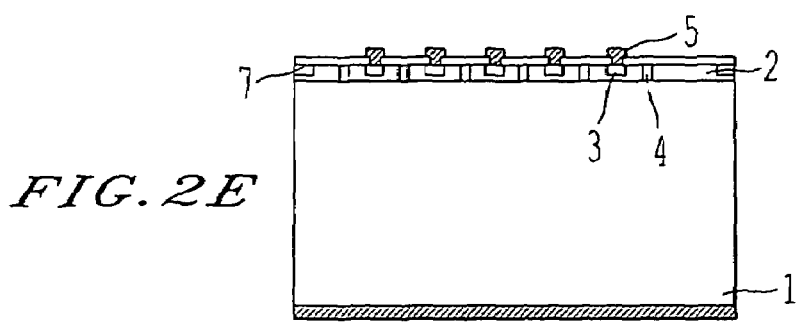

Furthermore, as shown in FIG. 2E, an insulation film 7 is formed on the whole surface, a contact hole is formed in the insulating film 7, and a p-side electrode 5 is formed so as to embed the contact hole therein. Thereafter, an n-side electrode 6 is formed on the surface on the opposite side of the n⁺-type silicon substrate 1 to the p-side electrode 5. In addition, there is no restriction on the order of the formation of the p-side electrode 5 and the formation of the n-side electrode 6.

By the steps described above, the semiconductor detector of the first embodiment of the invention is completed. In addition, the above-described process does not require a particular accuracy, and the semiconductor detector of the first embodiment of the invention can be produced using an ordinary semiconductor process.

(Second Embodiment)

In the first embodiment, the example wherein the p⁺-type silicon region 3 and the p-side electrode 5 are patterned in a lattice form respectively is shown, but in this embodiment, a different pattern form is explained.

Figure 3A:
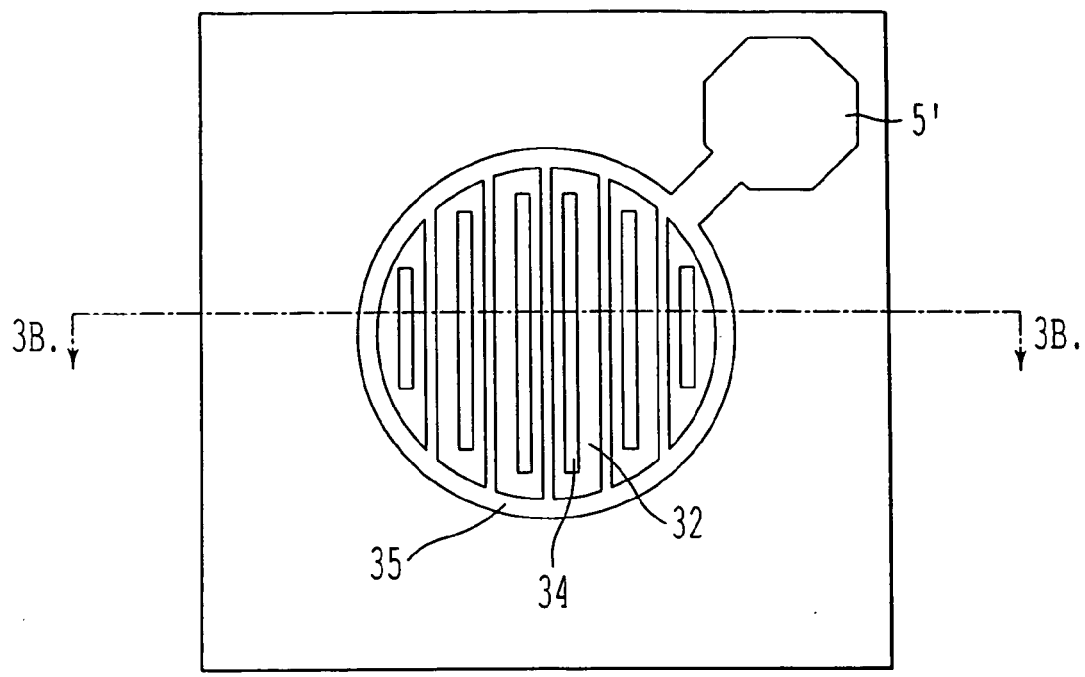
FIGS. 3A and 3B are a plan view and a cross-sectional view, respectively, showing a structure of the second embodiment of the semiconductor light-receiving element of the invention.
Figure 3B:
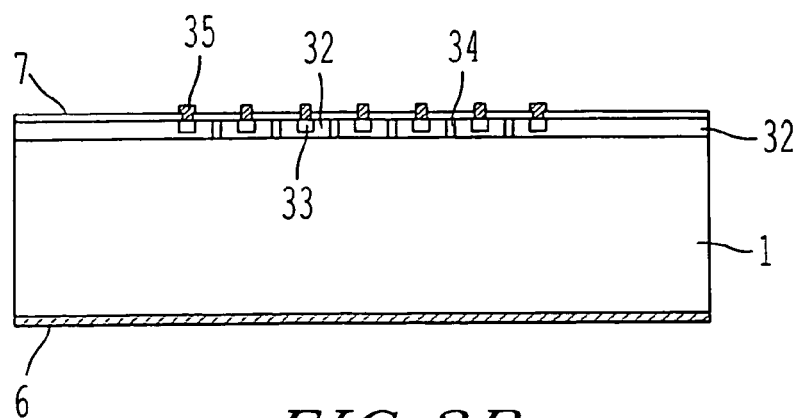

FIGS. 3A and 3B are a plan view and a cross-sectional view, respectively, showing a structure of the second embodiment of the semiconductor light-receiving element of the invention, wherein FIG. 3A is a plan view of the light-receiving element of the embodiment, and FIG. 3B is a cross-sectional view along the line A–A' of FIG. 3A. In FIGS. 3A and 3B the same marks denote the same portions as the portions of FIGS. 1A and 1B.

As shown in FIGS. 3A and 3B, an n⁻-type silicon layer 32 (impurity concentration: $1×10^{14}$ cm$^{-3}$, hereinafter, corresponding to i layer) having a high resistance is formed on one surface of an n⁺-type silicon substrate 1. The n⁻-type silicon layer 32 is a layer formed on the n⁺-type silicon substrate 1 by epitaxial growth.

In plural regions of the n⁻-type silicon layer 32, n⁺-type silicon regions 34 (impurity concentration: $1×10^{19}$ cm$^{-3}$) are formed by diffusion such that they reach the n⁺-type silicon substrate 1 from the surface of the n⁻-type silicon layer 32. The n⁺-type silicon regions 34 are formed in a columnar form and each is formed in a stripe form and arranged in one direction as shown in FIG. 3A.

On the surface of the $n^-$-type silicon layer 32 are formed $p^+$-type silicon region 33 (impurity concentration: $1\times10^{19}$ cm$^{-3}$) by diffusion so as to surround the periphery of the $n^+$-type silicon regions 34. In this example, as shown in FIG. 3A, each of the $p^+$-type silicon region 33 is formed in a network form. A depth of the $p^+$-type silicon region 33 is a depth of not reaching the $n^+$-type silicon substrate 1, and the $n^-$-type silicon layer 32 exists between the $p^+$-type silicon region 33 and the $n^+$-type silicon substrate 1.

On the surface of the $p^+$-type silicon region 33 is formed a p-side electrode 35, and as shown in FIG. 3A. The p-side electrode 35 is formed in a network form so as to substantially superpose the $p^+$-type silicon region 33. In addition, they are not always superposed with each other. The region where the p-side electrode 35 is formed may be included within the $p^+$-type silicon region 33, or the $p^+$-type silicon region 33 may be included within the region where the p-side electrode 35 is formed if the p-side electrode 35 is electrically insulated from each of the $n^{30}$-type silicon substrate 1, the $n^-$-type silicon layer 32, and the $n^+$-type silicon layer 34. In this case, however, for the requirement of ensuring a light-receiving amount, the former is more preferred. The p-side electrode 5 is electrically connected to an extraction electrode 5'.

In the semiconductor light-receiving element of the second embodiment, as in the case of the semiconductor light-receiving element of the first embodiment, by completely depleting the $n^-$-type silicon layer 32 occupying a large area within the light-receiving surface, the incident light on the light-receiving surface is enabled to contribute to a photoelectric current while reducing the light absorption in the $n^+$-type silicon regions 34, so that the sensitivity characteristics of the semiconductor light-receiving element can be made superior. The constituent features of the semiconductor light-receiving element described above can be formed by an ordinary semiconductor process, and the cost in the production process can be lowered.

Figure 4A:
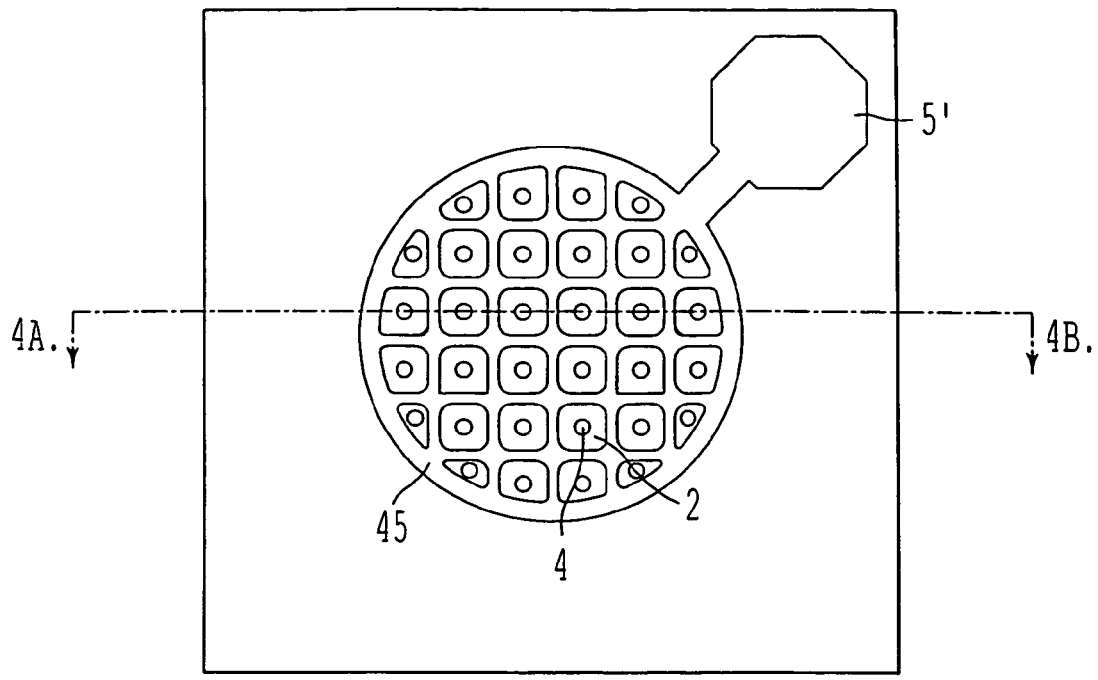
FIGS. 4A and 4B are a plan view and a cross-sectional view, respectively, showing a structure of another embodiment of the semiconductor light-receiving element of the invention.
Figure 4B:
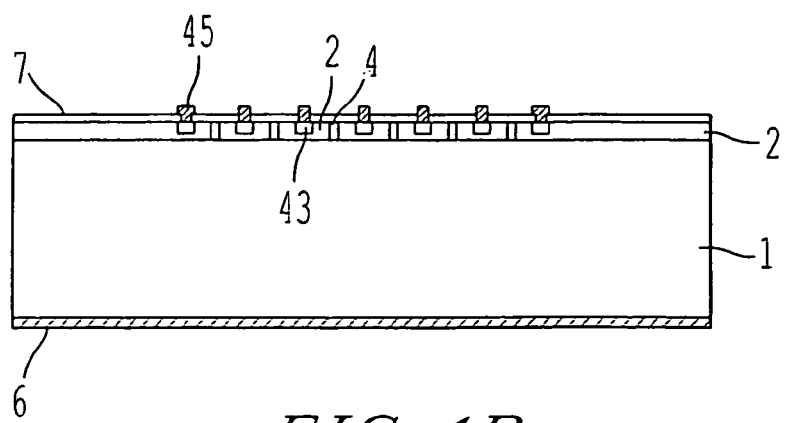

In addition, the present invention is not limited to the embodiments described above. For example, in the first embodiment, the forms of the $p^+$-type silicon regions 3 and the p-side electrode 5 are of a pattern in a lattice form having square meshes, but it is possible to use a pattern in a lattice form ($p^+$-type silicon regions 43, p-side electrode 45) having a round corner form as shown in a plan view of FIG. 4A. FIG. 4B is a cross-sectional view along the line A–A' in FIG. 4A. In this case, by removing sharp edges in the $p^+$-type silicon regions 43 and the p-side electrode 45, unnecessary concentration of the electric field can be restrained, whereby it becomes possible to obtain the light-receiving element of a high withstand voltage.

Figure 5A:
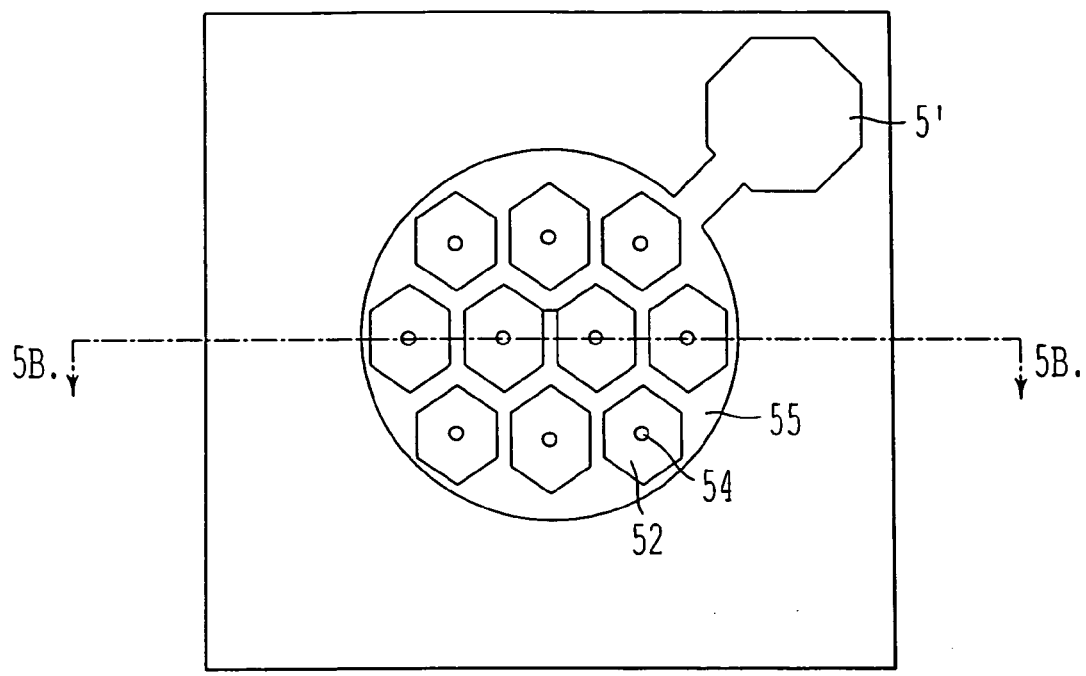
FIGS. 5A and 5B are a plan view and a cross-sectional view, respectively, showing a structure of another embodiment of the semiconductor light-receiving element of the invention.
Figure 5B:
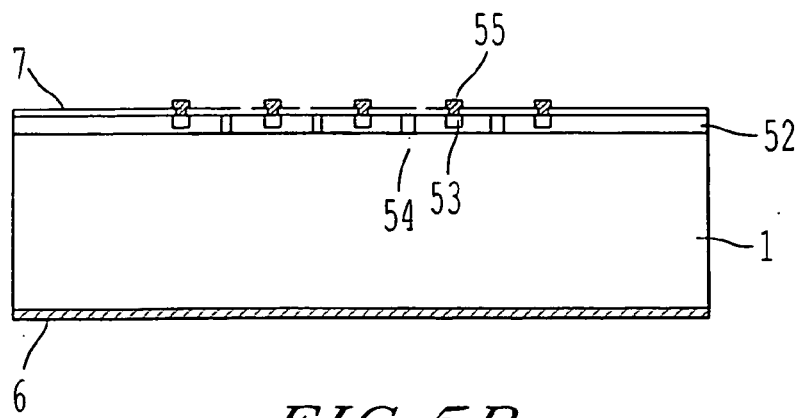

Also, in addition to the network form pattern shown in the second embodiment, a network form pattern ($p^+$-type silicon regions 53, p-side electrode 55) shown in a plan view of FIG. 5A can be used. FIG. 5B is a cross-sectional view along the line A–A' of FIG. 5A. In this case, by making angles of corner portions of the $p^+$-type silicon regions 53 and p-side electrode 55 obtuse, the light-receiving element can be densely distributed without need of excessive regions for increasing the angles while keeping the high withstand voltage of the light-receiving element as the embodiment shown in FIGS. 4A and 4B. Therefore, an area of the light-receiving element surface portion light-shielded by the p-side electrode 45 can be reduced, and a utilization efficiency of the incident light can be increased. In addition, in FIGS. 5A and 5B, element 52 is an $n^+$-type silicon layer, and 54 is an $n^+$-type silicon region.

Figure 6A:
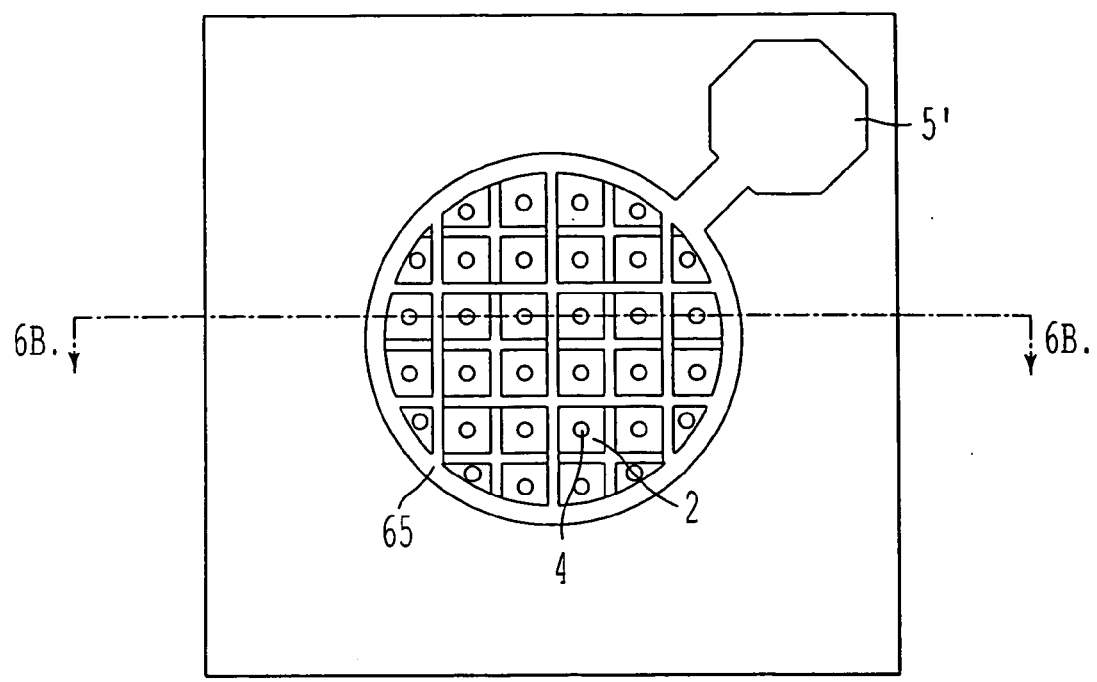
FIGS. 6A and 6B are a plan view and a cross-sectional view, respectively, showing a structure of a another embodiment of the semiconductor light-receiving element of the invention.
Figure 6B:
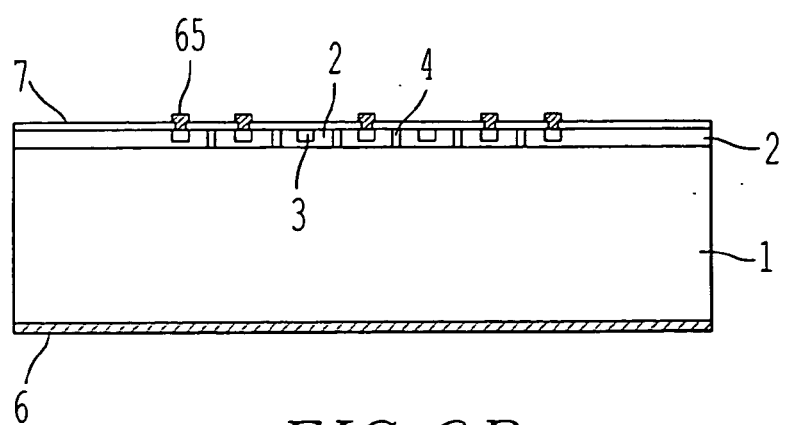
Figure 7:
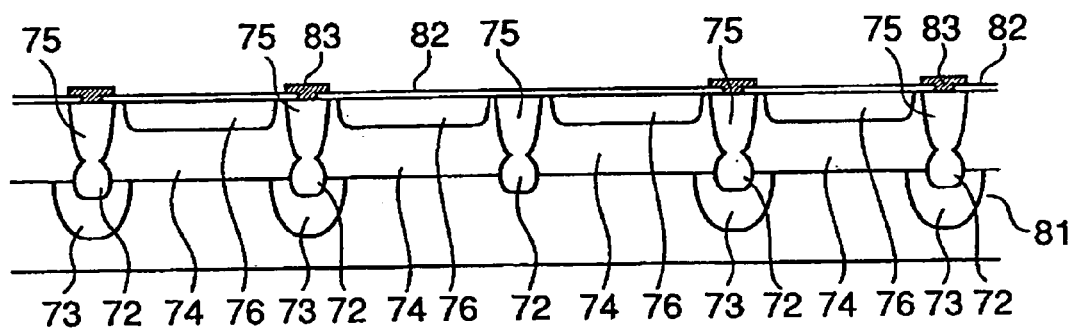
FIG. 7 is a cross-sectional view showing a structure of a semiconductor light-receiving element of the related art.

Also, it is not necessary that the p-side electrode have the same form as in the $p^+$-type silicon regions, and a pattern form of the p-side electrode may be a pattern form covering a part of the $p^+$-type silicon regions. For example, as shown in a plan view of FIG. 6A, a p-side electrode 65 can take a pattern form covering a part of the $p^+$-type silicon region 3. FIG. 6B is a cross-sectional view along the line A–A' of FIG. 6A. In this case, it is necessary that a serial resistance of the p-side electrode 65 is not becoming too large, but an area of the light-receiving surface portion light-shielded by the p-side electrode 65 can be reduced, and a utilization efficiency of the incident light can be increased. That is, in the light-receiving surface portion having no p-side electrode 65 on the $p^+$-type silicon region 3, the incident light is absorbed in the $p^+$-type silicon region 3, but a part of the incident light transmits therethrough and can contribute to a photoelectric current. In addition, in FIGS. 4A and 4B, FIGS. 5A and 5B, and FIGS. 6A and 6B, the same portions as those in FIGS. 1A and 1B are shown by the same marks as in FIGS. 1A and 1B.

Also, the $n^+$-type silicon substrate 1 and the $n^+$-type silicon regions 4a may be constructed in an integrated structure, and in this case, the semiconductor light-receiving element can be prepared using a semiconductor substrate of a low-impurity concentration. That is, by implanting or diffusing an ion of an n-type impurity from one side of an $n^-$-type semiconductor substrate of a low impurity concentration, a portion corresponding to the $n^+$-type silicon substrate 1 is formed, and on a surface on another side, portions corresponding to the $n^+$-type silicon regions 4a are formed as in the first embodiment. By contacting the portion corresponding to the $n^+$-type silicon substrate 1 with the portions corresponding to the $n^+$-type silicon regions 4a, the both are integrated together, whereby the above-described structure can be prepared. In this case, the portions corresponding to the $n^+$-type silicon regions 4a correspond to the plural surface portions of the first conductive type semiconductor substrate, which are exposed apart from each other, in the second aspect of the invention.

Furthermore, by the requirement of the design, the size of the light-receiving element structure, the kind of the ion, the conductive type, etc., can be changed, and the invention is not limited to the above-described embodiments. When an absorption coefficient is large as in a blue light to silicon, even when the thickness of the light-absorption layer is thin, a high absorption coefficient can be obtained, so that the thickness of each layer constituting the light-receiving element can be made thin. Furthermore, in the case of using other materials than silicon, by using the structure of the light-receiving element of the invention depending upon the absorption coefficient of the material used and the wavelength, the same effects as in the embodiments described above can be obtained.

Numerous modifications and variations of the present invention are possible in light of the above teachings. It is therefore to be understood that within the scope of the appended claims, the invention may be practiced otherwise than as specifically described therein.

What is claimed as new and desired to be secured by Letters Patent of united states is:

1. A semiconductor light-receiving device comprising:
   a semiconductor substrate having a first surface on a light-receiving side and a second surface on the opposite side to said first surface, said semiconductor substrate comprising a first conductivity type;
   a semiconductor layer formed on said first surface of said semiconductor substrate;

a plurality of first semiconductor regions formed in said semiconductor layer so as to reach said semiconductor substrate from a surface of said semiconductor layer, said plurality of first semiconductor regions being formed apart from each other, and comprising the first conductivity type;

a second semiconductor region selectively formed in a surface region of said semiconductor layer, said second semiconductor region having a lattice form or a network form to surround each of said plurality of first semiconductor regions with surface portions of said semiconductor layer therebetween and comprising a second conductivity type;

a first electrode formed on said second semiconductor region and having a lattice form or a network form;

a second electrode formed on said second surface of said semiconductor substrate;

said surface portions of said semiconductor layer between each of said plurality of first semiconductor regions and said second semiconductor region having higher resistances than resistances of said plurality of first semiconductor regions and said second semiconductor region; and depletion regions predominantly spreading in directions along the surface of said semiconductor layer between said second semiconductor region and each of said plurality of first semiconductor regions configured to deplete said surface portions of said semiconductor layer completely in a state in which a reverse bias is applied between said first electrode and said second electrode, wherein said surface portions of said semiconductor layer receive incident light predominantly in the surface of said semiconductor layer.

2. The semiconductor light-receiving device according to claim 1, wherein said first electrode is formed on part of said second semiconductor region.

3. The semiconductor light-receiving device according to claim 1, wherein each of said plurality of first semiconductor regions has an island form or a stripe form.

4. A semiconductor light-receiving device comprising:
a semiconductor substrate having a first surface on a light-receiving side and a second surface on the opposite side to said first surface, said semiconductor substrate comprising a first conductivity type;
a semiconductor layer formed on said first surface of said semiconductor substrate;
a plurality of first semiconductor regions formed in said semiconductor layer so as to reach said semiconductor substrate from a surface of said semiconductor layer, said plurality of first semiconductor regions being formed apart from each other, and comprising the first conductivity type;
a second semiconductor region selectively formed in a surface region of said semiconductor layer and having a plurality of openings, each of said plurality of first semiconductor regions being provided within each of said plurality of openings of said second semiconductor region respectively with surface portions of said semiconductor layer therebetween and comprising a second conductivity type;
a first electrode formed on said second semiconductor region and having a lattice form or a network form;
a second electrode formed on said second surface of said semiconductor substrate;
said surface portions of said semiconductor layer between each of said plurality of first semiconductor regions and said second semiconductor region having higher resistances than resistances of said plurality of first semiconductor regions and said second semiconductor region; and
depletion regions predominantly spreading in directions along the surface of semiconductor layer between said second semiconductor region and each of said plurality of first semiconductor regions configured to deplete said surface portions of said semiconductor layer completely in a state in which a reverse bias is applied between said first electrode and said second electrode;
wherein said surface portions of said semiconductor layer receive incident light predominantly in the surface of said semiconductor layer.

5. The semiconductor light-receiving device according to claim 4, wherein said first electrode is formed on part of said second semiconductor region.

6. The semiconductor light-receiving device according to claim 4, wherein each of said plurality of first semiconductor regions has an island form or a stripe form.

7. A semiconductor light-receiving device comprising:
a semiconductor substrate having a first surface on a light-receiving side and a second surface on the opposite side to said first surface, said first surface including a plurality of protruded surface portions separated from each other, and said semiconductor substrate comprising a first conductivity type;
a semiconductor layer selectively formed on said first surface of said semiconductor substrate, said semiconductor layer having a higher resistance than a resistance of said semiconductor substrate and having a plurality of openings, each of said plurality of protruded surface portions of said first surface being positioned within each of said plurality of openings of said semiconductor layer respectively;
a semiconductor region selectively formed in a surface region of said semiconductor layer and having a lattice form or a network form to surround each of said plurality of protruded surface portions of said first surface with surface portions of said semiconductor layer therebetween, said semiconductor region comprising a second conductivity type;
a first electrode formed on said semiconductor region and having a lattice form or a network form;
a second electrode formed on said second surface of said semiconductor substrate; and
depletion regions predominantly spreading in directions alone the surface of said semiconductor layer between said second region and each of said plurality of protruded surface portions of said semiconductor substrate configured to deplete said surface portions of said semiconductor layer completely in a state in which a reverse bias is applied between said first electrode and said second electrode,
wherein said surface portions of said semiconductor layer receive incident light predominantly in the surface of said semiconductor layer.

8. The semiconductor light-receiving device according to claim 7, wherein said first electrode is formed on part of said semiconductor region.

9. The semiconductor light-receiving device according to claim 7, wherein each of said plurality of protruded surface portions of said semiconductor substrate has an island form or a stripe form.

10. A semiconductor light-receiving device comprising:
a semiconductor substrate having a first surface on a light-receiving side and a second surface on the opposite side to said first surface, said first surface including a plurality of protruded surface portions separated from each other, and said semiconductor substrate comprising a first conductivity type;

a semiconductor layer selectively formed on said first surface of said semiconductor substrate, said semiconductor layer having a higher resistance than a resistance of said semiconductor substrate and having a plurality of openings, each of said plurality of protruded surface portions of said first surface being positioned within each of said plurality of openings of said semiconductor layer respectively;

a semiconductor region selectively formed in a surface region of said semiconductor layer and having a plurality of openings, each of said plurality of protruded surface portions of sand first surface being provided within each of said plurality of openings of said semiconductor region respectively with surface portions of said semiconductor layer therebetween, and said semiconductor region comprising a second conductivity type;

a first electrode formed on said semiconductor region and having a lattice form or a network form;

a second electrode formed on said second surface of said semiconductor substrate; and depletion regions predominantly spreading in directions along the surface of said semiconductor layer between said semiconductor said semiconductor region and each of said plurality of protruded surface portions of said semiconductor substrate configured to deplete said surface portions of said semiconductor layer completely in a state in which a reverse bias is applied between said first electrode and said second electrode, wherein said surface portions of said semiconductor layer receive incident light predominantly in the surface of said semiconductor layer.

11. The semiconductor light-receiving device according to claim 10, wherein said first electrode is formed on part of said semiconductor region.

12. The semiconductor light-receiving device according to claim 10, wherein each of said plurality of protruded surface portions of said semiconductor substrate has an island form or a stripe form.

* * * * *